United States Patent [19]

Boecker et al.

[11] Patent Number: 4,701,427

[45] Date of Patent: Oct. 20, 1987

[54] SINTERED SILICON CARBIDE CERAMIC BODY OF HIGH ELECTRICAL RESISTIVITY

[75] Inventors: Wolfgang D. G. Boecker, Lewiston; Laurence N. Hailey, Niagara Falls; Carl H. McMurtry, Youngstown, all of N.Y.

[73] Assignee: Stemcor Corporation, Cleveland, Ohio

[21] Appl. No.: 789,066

[22] Filed: Oct. 17, 1985

[51] Int. Cl.$^4$ .................... C04B 35/52; C04B 35/56; B29C 67/00; F22B 9/04

[52] U.S. Cl. ........................ 501/92; 501/90; 501/91; 264/125; 264/65

[58] Field of Search ............... 501/92, 90, 91; 264/125, 65; 419/39

[56] References Cited

U.S. PATENT DOCUMENTS

| | | | |
|---|---|---|---|
| 4,004,934 | 1/1977 | Prochazka | 501/92 |
| 4,124,667 | 11/1978 | Coppola et al. | 501/92 |
| 4,135,938 | 1/1979 | Murata et al. | 501/92 |
| 4,144,207 | 3/1979 | Ohnsorg | 501/92 |
| 4,230,497 | 10/1980 | Schwetz et al. | 501/90 |
| 4,370,421 | 1/1983 | Matsushita et al. | 501/90 |

FOREIGN PATENT DOCUMENTS 60-176913 9/1985 Japan ............................ 501/92

Primary Examiner—Stephen J. Lechert, Jr.
Assistant Examiner—J. E. Thomas
Attorney, Agent, or Firm—D. M. Ronyak

[57] ABSTRACT

Sintered silicon carbide body having a D.C. electrical resistivity of at least $10^8$ Ohm cm at 25° C., a density of at least 2.95 g/cm$^3$ is formed upon sintering in a nitrogenous atmosphere at a temperature of about 2250° C. or greater, a shaped body composed essentially of carbon or carbon source material in amount sufficient to provide up to 2.5 percent uncombined carbon; from about 0.4 to about 2.0 percent boron carbide; up to 25 percent of temporary binder and a balance of silicon carbide which is predominantly alpha-phase. The shaped body may additionally include other sintering aids such as BN or Al without destruction of desired high electrical resistivity.

35 Claims, 1 Drawing Figure

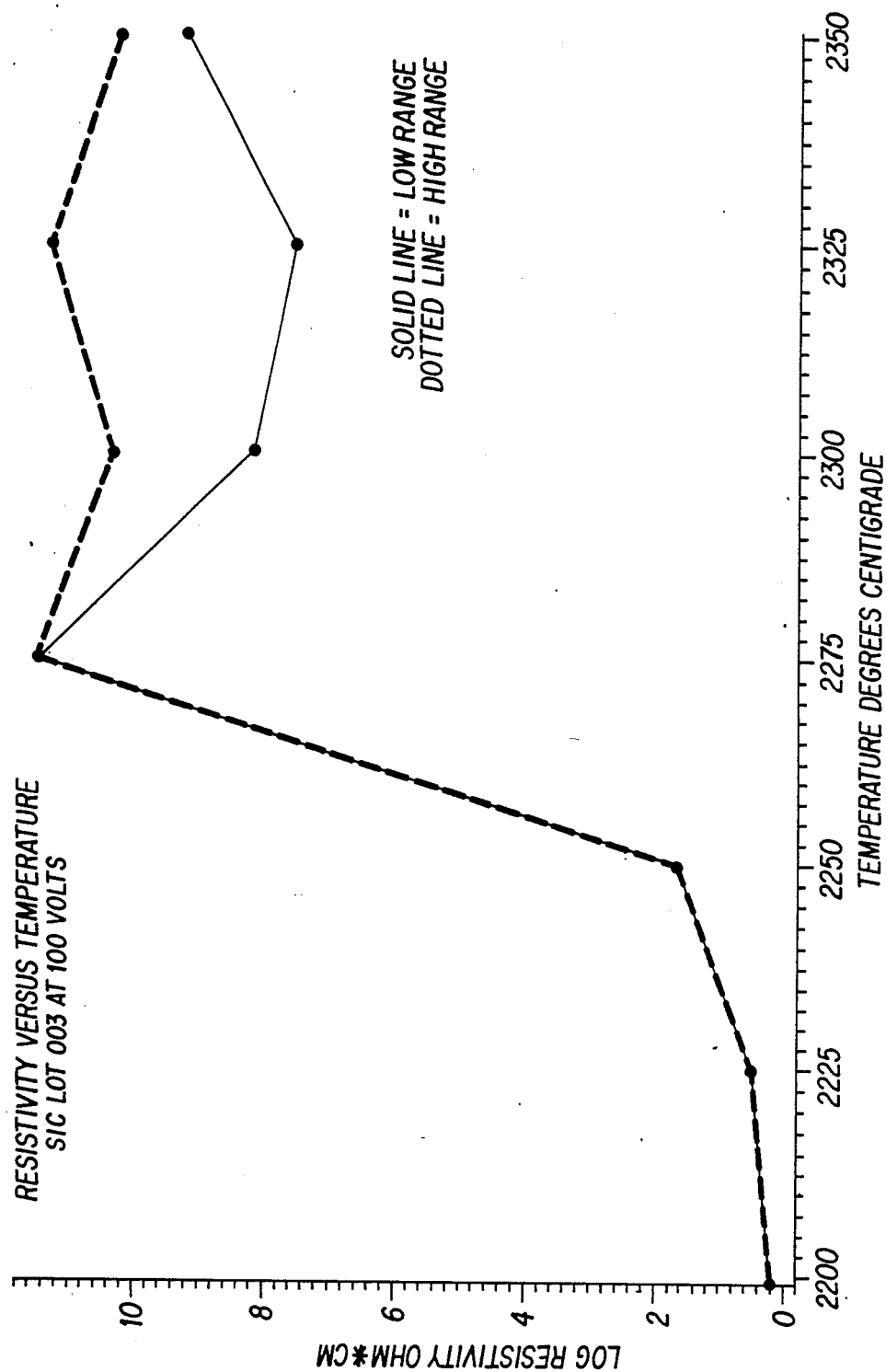

SINTERED SILICON CARBIDE CERAMIC BODY OF HIGH ELECTRICAL RESISTIVITY

BACKGROUND OF THE INVENTION

This invention relates to a sintered silicon carbide ceramic material having very high electrical resistivity, and a process for making such a material. Such material is suited for use in manufacture of a body suitable for use as a heat conducting electrical insulator for electrical and electronic devices. Such a heat conducting electrical insulator may be referred to as a substrate. This invention particularly relates to sintered, substantially homogeneous, silicon carbide ceramic bodies which have an electrical resistivity of at least about $10^8$ Ohm cm, and to a process for sintering of a ceramic body having such electrical resistivity.

For many devices in the electrical and electronics industry, there is a present and growing need for material of high thermal conductivity and high electrical resistivity. Such materials can then serve to conduct electrically generated heat to the ambience, while acting as a barrier for electrical currents to that same ambience. Additionally, it is often very desirable that the materials be readily formed into complex shapes at low cost; for ceramic materials, this often requires pressureless sintering.

The semiconductor industry has progressed rapidly in recent years. The number of circuit constituents such as semiconductor chips are being formed in increasingly higher density on an electrically insulating substrate. To meet the demand for devices of greater capacity and smaller scale size, there is continued development of large scale integrated circuits and very high speed integrated circuits of increasing junction density. These trends result in increased demand for electrically insulating substrates of higher thermal conductivity and/or higher thermal diffusivity to remove the heat generated during operation of these circuits.

Conventionally there is employed for the substrate an alumina ($Al_2O_3$) sintered body. A sintered alumina body typically has an electrical resistivity of about $10^{14}$ Ohm cm at 25° C. and a thermal conductivity of about 20-25 W/mK (watts per meter kelvin). The density and speed of operation of new circuit design is limited by the thermal conductivity of these alumina substrates.

Characteristics of an ideal substrate material include the following:
(1) high electrical resistivity;
(2) high thermal conductivity;
(3) coefficient of expansion close to that of silicon;
(4) high mechanical strength;
(5) metallizable, and
(6) low dielectric constant at frequencies of 10 MHz (megahertz) or more.

A sintered body of silicon carbide has a coefficicent of linear thermal expansion of about $3.7 \times 10^{-6}$/°C. which is near to that of silicon which is about $3.3 \times 10^{-6}$/°C. Additionally, the variation with temperature of the coefficient of thermal expansion of silicon carbide is very close to that of silicon throughout the range of 25°–1000° C. The chemical and physical properties of silicon carbide make it an excellent material for high temperature structural applications. These desirable properties include good oxidation resistance and corrosion resistance, high thermal conductivity compared to alumina, low expansion coefficient compared to alumina, high resistance to thermal shock, and high strength even at an elevated temperature. These properties are achieved by known bodies of sintered silicon carbide, including those produced by pressureless sintering. However, these known silicon carbide bodies exhibit electrical resistivities of typically $10^2$ and at most up to about $10^6$ Ohm cm which are well below those required for use as substrates in integrated circuits.

No one has been able to make an electrically insulating silicon carbide grain. The single crystal resistivity of various types of silicon carbide crystals is given in "Silicon Carbide-1973, Proceedings of the Third International Conference," Miami, Fla., September 1973, edited by R. C. Marshall et al, University of South Carolina Press, Columbia, SC. None of the 6H alpha-phase, single crystal poly types, characterized at Appendix II at page 673, exhibited an electrical resistivity of greater than 95 Ohm cm at 25° C.

From U.S. Pat. No. 4,370,421, there is known an electrically insulating, high thermal conductivity substrate consisting of silicon carbide as its principal component. This material is formed by adding 0.1 to 3.5 weight percent of beryllium oxide powder, calculated as beryllium, to silicon carbide powder which additionally contains aluminum, boron and free carbon components in amounts restricted to, at most, 0.1 weight percent, at most, 0.1 weight percent and, at most, 0.4 weight percent, respectively. Given the toxicity of beryllium oxide, it is desired to provide a sintered silicon carbide body suitable for use as a substrate which does not contain beryllium compounds or employ beryllium oxide in its manufacture.

Bodies of silicon carbide have heretofore been produced by reaction bonding (also known as reaction sintering) and hot pressing. Reaction sintering involves use of silicon impregnants to upgrade the density of silicon carbide through reaction with excess carbon in the substrate. Reaction sintering is useful for many applications but is undesirable where excess silicon exuding from the silicon carbide body would be detrimental (e.g. high temperatures in excess of 1400° C.). Reaction sintered silicon carbide bodies typically exhibit low electrical resistivity; e.g., 0.2 Ohm cm. Hot pressing (the production of high density silicon carbide ceramic bodies by simultaneous application of heat and pressure) is impractical for complex shapes because the pressure required (typically of the order of greater than 1000 psig) cannot be uniformly transmitted to all parts of the required mold, which results in a deformed body. Also, difficulty may be encountered in removing a hot pressed part from a complex mold.

U.S. Pat. No. 3,960,577 describes a hot pressed silicon carbide body having a maximum room temperature electrical resistivity of 50 Ohm cm. This hot pressed body has a density of at least 98 percent of theoretical density of silicon carbide and is substantially non-porous. This material is hot pressed at 5,000 to 10,000 psi at 1950° C. to 2050° C. from a mixture of submicron beta phase silicon carbide, sufficient boron-containing additive to provide 0.3 to 3.0 percent boron and 3.5 to 10 percent of $Si_3N_4$. The sintered product is described as having sufficient nitrogen atoms accommodated in the lattice of silicon carbide to make it conductive with the boron additive in solid solution in the silicon carbide.

U.S. Pat. Nos. 4,312,954; 4,124,667; 4,346,049; 4,179,299; 4,135,938; 4,172,109; 4,123,286; 4,135,937; 4,144,207; 4,207,226, and 4,237,085 disclose pressureless sinterable silicon carbide compositions that may contain, in some instances, up to 5 percent uncombined carbon in the final sintered silicon carbide product and, in other instances, up to 6 percent uncombined carbon in the final sintered product and which are prepared from silicon carbide, boron carbide and a free carbon source. U.S. Pat. No. 4,525,461 describes a pressureless sintered silicon carbide/graphite/carbon composite ceramic body, of which certain embodiments have very low electrical resistivity. A hot pressed body formed according to U.S. Pat. Nos. 4 135 937 and 4,135,938 may contain up to 15 percent additional carbon (beyond that in the original particulate silicon carbide) derived from graphite or carbonized organic composition. In U.S. Pat. No. 4,135,938 the belief is stated that most of the additional carbon is chemically combined with the silicon carbide and additive compound (for example, BP, BN or $AlB_2$). None of these Patents, excepting U.S. Pat. No. 4,370,321, disclose a sintered predominantly silicon carbide ceramic body having sufficient specific electrical resistivity for use as an electrically insulating substrate as is required for integrated circuits.

Thus, there remains a need for a silicon carbide material which is prepared from non-toxic ingredients and which can be cost effectively manufactured into complex shapes desired for electrically insulating devices.

The terms "free" and "uncombined" as used herein are synonymous and mean "not chemically combined." For example, uncombined carbon in a sintered body according to the present invention is not chemically combined with, for example, silicon to form silicon carbide.

In this abstract, specification and claims, unless otherwise indicated, all quantities, proportions and ratios are stated on a weight basis.

SUMMARY OF THE INVENTION

According to an aspect of this invention, there is provided a sintered silicon carbide body of high electrical resistivity from ingredients which include alpha-phase non-cubic crystalline silicon carbide, a sintering aid and an electrical insulating aid or its precursor. The sintering aid and electrical insulating aid or precursor may be the same or different materials.

According to an aspect of this invention, there is provided a pressureless sintering process for the production of such silicon carbide bodies.

According to an aspect of the present invention, there is provided an electrically insulating ceramic material comprising a sintered body composed essentially of polycrystalline, sintered, silicon carbide, having between at least a portion of the grains thereof areas of uncombined carbon which contain both boron and nitrogen, and within the grains of silicon carbide, boron nitride precipitates.

According to an aspect of the present invention, there is provided an electrically insulating ceramic material comprising a sintered body composed essentially of:
(a) up to 1.0 percent uncombined carbon;
(b) 0.3 to 1.0 percent boron;
(c) 0.03 to 0.8 percent nitrogen;
(d) and a balance of silicon carbide;
said sintered body having a density of at least 2.95 g/cm$^3$ and a D.C. electrical resistivity of at least $10^8$ Ohm cm at 25° C.

According to another aspect of the present invention, there is provided a process for the production of silicon carbide ceramic body having an electrical resistivity of at least about $10^8$ Ohm cm at 25° C. comprising a process for the production of a silicon carbide ceramic body having a D.C. electrical resistivity of at least $10^8$ Ohm cm at 25° C., comprising:
(a) forming a shaped body having a density, before sintering of at least about 1.45 g/cm3, the shaped body composed essentially of:
  (i) carbon or carbon source material in amount sufficient to provide upon in situ decomposition up to 2.5 percent uncombined carbon;
  (ii) from about 0.4 to about 2.0 percent boron carbide calculated as $B_4C$;
  (iii) a balance of silicon carbide which is predominately alpha-phase; and, in addition
  (iv) up to 25 percent of temporary binder;
(b) sintering said shaped body under substantially pressureless conditions in a nitrogenous atmosphere at a temperature of about 2250° C. or greater, for a time sufficient to produce a sintered body having a density of at least 2.95 g/cm$^3$ and an electrical resistivity of at least $10^8$ Ohm cm at 2500° C.

BRIEF DESCRIPTION OF THE DRAWING

The single FIGURE of drawing is a graph of sintering temperature versus electrical resistivity for certain sintered silicon carbide bodies.

DETAILED DESCRIPTION OF THE INVENTION

The theoretical density of silicon carbide is 3.21 g/cm$^3$. The minimum density for sintered silicon carbide ceramic bodies, according to the present invention, corresponds to at least about 92 percent of theoretical density for silicon carbide, i.e., about 2.95 g/cm$^3$. Higher density is generally preferred, e.g. 95 or greater percent of theoretical for silicon carbide. It has been found that the desired minimum specific electrical resistivity of $10^8$ Ohm cm does not reliably occur when the sintered body is of density below about 92 percent of theoretical for silicon carbide. Mechanical properties, particularly modulus of rupture (MOR), also decline as sintered density declines Sintered bodies which are of lower density exhibit greater porosity, which may render them unsuitable for hermetically sealed circuits. Porosity may also interfere with cleaning steps required for effective metallization.

1. Starting Components Or Ingredients

A. Silicon Carbide Powder

The crystalline habit of the silicon carbide starting material has been found to be highly important. Essentially alpha, non-cubic, silicon carbide is the preferred starting material. Such alpha-phase silicon carbide may be obtained from use of the Acheson process. Alpha silicon carbide derived from the Acheson process typically contains a variety of polytypes, the most common being 6H, 4H, 2H and rhombohedric polytypes, e.g., 15R. It is believed to be acceptable, however, to use mixtures of alpha and beta and/or amorphous silicon carbide in which alpha silicon carbide predominates.

The silicon carbide powder must be of fine particle size. Coarser material can be ball milled until sufficient amounts of fine silicon carbide are obtained and the proper size of silicon carbide can be selected from the ball milled product by conventional means, such as water sedimentation. Sintered silicon carbide grinding media are preferably employed to avoid contamination. Suitable silicon carbide powders have maximum particle size of about 5 microns or less, and preferably submicron size particles predominate. It is difficult, however, to obtain accurate particle size distributions for silicon carbide powders having a particle size of much less than 1 micron and the surface area of the silicon carbide particle is a more relevant characteristic in determining suitable material. Accordingly, the preferred silicon carbide particles for use in the process of the present invention to produce sintered composite ceramic bodies of the present invention are specefied as having from about 1 to about 100 square meters/gram surface area. Within this range it is more preferred that the surface area of the silicon carbide particles range between about 5 and 50 square meters/gram and within this range surface areas between about 7 and about 15 square meters/gram have been found to be easily obtainable and quite useful for producing sintered composite ceramic bodies of the present invention.

The silicon carbide material should be relatively free of materials such as silicon, silicon dioxide and oxygen which may interfere with the sintering operation. The silicon carbide powder may contain minor amounts of impurities such as graphite, aluminum, boron or free silicon without deleterious effect; generally, a purity of greater than about 95 percent is required and a higher purity is desired. Acceptably pure silicon carbide powder and its preparation is described in U.S. Pat. No. 4,123,286 to Coppola et al. An amount of free silicon up to about ½ percent, and an amount of silica up to 1 percent in the raw batch, have not been found to cause undesired results. Greater silicon and silica content in the raw batch generally requires greater carbon content to achieve desired results under pressureless sintering conditions.

Commercially available silicon carbide powder usually contains some uncombined carbon in the form of graphite, typically about one-half percent, and at times from some sources contains as much as 2 percent. The total free carbon present, including that in the form of graphite, must be adjusted accordingly to maintain the limits herein set forth.

B. Sintering Aid

Materials which react with the silicon carbide ceramic material at sintering temperatures to form a sintered product having an electrical resistivity of at least about $10^8$ Ohm cm are utilized as sintering aids. Carbides of boron are particularly useful as a sintering aid and as a precursor to in situ formation of an electrical insulation phase. When pressureless sintering is employed, boron nitride used alone is not useful at levels up to about 2.5 percent because their use does not result in a sintered product of sufficiently high electrical resistivity. Elemental boron alone has not been found to result in a sintered product of high electrical resistivity. Elemental aluminum, aluminum nitride, elemental boron and boron nitride can be used in small quantities in combination with boron carbide to produce a pressureless sintered product having electrical resistivity of at least $10^8$ Ohm cm. The use of these sintering aids generally results in sintered bodies of lower resistivity than when boron carbide is used alone.

Boron-containing sintering aid should be present in the raw batch in a quantity sufficient to provide from about 0.30 to about 2.50 percent by weight of silicon carbide of elementTl boron and preferably between about 0.50 and 1.50 percent. When the sintering aid is present in the raw batch in an amount sufficient to yield greater than about 2.50 percent of weight of elemental boron, the electrical resistivity of the sintered body has been observed to fall below $10^8$ Ohm cm. Conversely, when less than 0.30 percent by weight of elemental boron is provided in the raw batch, based on the weight of silicon carbide present, the desired minimum electrical resistivity of the silicon carbide body does not reliably occur, and the electrical resistivity is generally less than about $10^6$ Ohm cm.

The best results with regard to densification and electrical resistivity are obtained with borom carbide ($B_4C$) as a sintering aid in a quantity that results in a sintered article having a boron content of from about 0.35 to 0.7 percent by weight of the sintered article. However, for the relatively low amounts of materials present in addition to silicon carbide, these percentages may conveniently be applied without significant error to refer to the composition by weight of the raw batch and sintered article.

Boron carbide is essentially a non-stoichiometric material and various boron carbide materials having a molar ratio of boron-to-carbon between 8 to 1 and 2 to 1 have been reported. It is generally preferred to use boron carbide as the boron source, and particularly a form of boron which is called "solid state reacted boron carbide" having a molar ratio of boron-to-carbon between about 3.5 to 1 and 4.1 to 1. Such a solid state reacted boron carbide can be produced in accordance with the process of U.S. Pat. No. 3,379,647 to P. A. Smudski. Boron carbides having a molar ratio of boron-to-carbide even greater than 4.1 to 1 are also believed to be suitable, but these materials are relatively less available and considerably more expensive and, therefore, not preferred.

The boron carbide can be crystalline or non-crystalline, preferably particulate, and of a size less than 10 microns. Within this limitation, it is preferred that the boron carbide be of a size ranging from about 0.1 to about 4 microns to facilitate forming a homogeneous mixture with the other component ingredients. Use of smaller particulate size boron carbide has been found to produce pressureless sintered bodies of highest electrical resistivity. Use of amorphous $B_4C$, having a surface area of greater than about 50 square meters/gram, has resulted in pressureless sintered bodies having electrical resistivity of $10^{12}$ Ohm cm.

Predoping of the silicon carbide powder with boron or boron carbide is also believed to be operable.

C. Carbon

Uncombined carbon is also believed to be necessarily present in an amorphous form in small quantity at the beginning of sintering. Sufficient uncombined carbon may be present in the silicon carbide powder as received and even after acid treatment. Treated submicron silicon carbide powder typically contains at least 0.2 percent uncombined carbon. The presence of sufficient uncombined carbon may be determined empirically by mixing the silicon carbide powder with $B_4C$ and pressureless sintering the mixture. Suitable carbon sources are described in U.S. Pat. Nos. 4,312,954, 4,179,299 and 4,525,461, the entire contents of each being herein incorporated by reference. When it is desired to provide a mixture which can be reliably pressureless sintered to a density of greater than 2.95 g/cm³ and an electrical resistivity of at least about $10^8$ Ohm cm, uncombined carbon is present in an amount not exceeding about 3 percent by weight of the batch which corresponds to free carbon addition of usually not more than about 2.5 percent. Highest electrical resistivity is obtained when the amount of uncombined carbon in the raw batch is 2 percent or less.

This uncombined carbon is best provided by use of an organic solvent soluble, organic material which can be coked at temperatures below sintering temperatures, e.g., below about 1000° C., to form amorphous carbon. Particularly preferred materials are phenolic resins and coal tar pitch which have char yields of from about 40 to 60 percent, respectively, although any solvent soluble organic material which can be coked to provide amorphous uncombined carbon having a carbon content of from about 25 to about 75 percent by weight is acceptable. From about 0.67 to about 6 percent by weight of such an organic solvent soluble organic material is employed in the raw batch.

The raw batch desirably contains between about 1.25 and 2.5 percent by weight of an organic solvent soluble organic material having a char yield between about 40 and 45 percent by weight. Particularly desirable are B-stage resole phenolic resins. Highly suitable resins are Plyophen$^{tm}$ 90-151, a phenol formaldehyde product available from Reichold Chemicals, Inc., White Plains, N.Y. and Resin 8121, a B-stage resole phenolic resin available from Varcum Chemical Company, Niagara Falls, N.Y.

No direct correlation has been established between the amount of uncombined carbon in the sintered body and the amount of uncombined carbon in the raw batch. The amount of $B_4C$ and the specific sintering conditions, including furnace construction and history, and furniture employed, such as graphite crucibles, appear to influence these values.

The most preferred amount of uncombined carbon in the sintered ceramic body is believed to be less than about 0.4 percent.

D. Temporary Binder

The raw batch may contain optionally a temporary binder to facilitate forming from the raw batch a shaped green body which is to be thereafter sintered. Details of suitable temporary binders and their use are disclosed in U.S. Pat. Nos. 4,312,954, 4,179,299, 4,346,049 and 4,525,461. The temporary binder may be employed in amounts up to about 25 percent by weight of the batch. It is to be noted that a temporary binder, when present, may contribute to the quantity of free carbon (amorphous carbon) present in the batch and the total uncombined carbon present is to be adjusted accordingly to maintain the limits herein set forth.

Preparing the Raw Batch

A. Mixing

The process for producing a sintered silicon carbide ceramic body according to the present invention begins with mixing together of the ingredients of the raw batch, namely from about 0.67 to about 6 percent by weight of organic material which can be coked to yield amorphous uncombined carbon; from about 0.4 to about 2.0 percent by weight of boron carbide ($B_4C$) sintering aid; and optionally up to 25 percent by weght of a temporary binder with the balance being silicon carbide powder. If a temporary binder such as polyvinyl alcohol including a quantity of water is employed, the first mixing step preferably includes stirring the powdered materials (silicon carbide, organic material and boron carbide sintering aid) together with the temporary binder and temporary binder vehicle prior to adding an organic solvent in which the organic material is soluble. In any event, after the organic solvent is added, the raw batch and organic solvent should be stirred in such a way as to disperse the organic solvent soluble, organic material which can be coked about the silicon carbide of the raw batch suitably for at least about 5 minutes and preferably about 15 minutes. Alternatively, the ingredients may be dispersed by milling in a conventional ball mill or processing in a vibro-energy mill.

Following this mixing step, the mixture is dried in conventional manner by any suitable technique such as passing a quantity of drying gas, such as nitrogen, through or near the stirred mixture or by pan or spray drying of the mixture.

Following this drying step, the dried mixture is preferably screened so it will pass a 40 mesh and preferably a 60 to 80 mesh sieve (U.S. Standard).

B. Shaping

Following the drying and sieving steps, the dried mixture is shaped in such a way as to produce a shaped body preferably having a density of at least about 45 percent of theoretical, i.e., 1.45 g/cm$^3$ and preferably between about 50 and about 65 percent of theoretical, i.e., between about 1.60 and about 2.10 g/cm$^3$ respectively. This shaping can be accomplished by any of a variety of techniques which are in themselves known; for example, by extrusion, injection molding, transfer molding, casting, including tape casting, cold pressing, isostatic pressing, or by compression molding. Suitable pressures are between about 8,000 and 25,000 psi and preferred pressures are between about 15,000 and 20,000 psi.

When a temporary binder is present, the temporary binder may be and is preferably cured by heating the shaped body at an appropriate temperature below coking temperature for an appropriate time. This results in improved strength of the shaped body and thereby facilitates machining of the shaped body, if necessary, to attain the desired shape. For example, when the temporary binder is polyvinyl alcohol, it may be cured by heating the shaped body at a temperature of about 90° C. to about 150° C. for about 1 to about 2 hours. The shaped body may be easily machined, if desired, at this time.

C. Sintering

The shaped body is then fired to produce a sintered silicon carbide ceramic body according to the invention. Firing tkes place from about ½ hour to about 2 hours at maximum temperatures of from greater than about 2250° C. to less than about 2350° C., preferably from about 2275° C. to about 2325° C. Due to the nature of the furnaces and the high temperatures involved, total firing cycle time is much greater than the time at maximum temperature. Temperatures lower than about 2250° C. do not reliably achieve the desired specific electrical resistivity, and higher temperatures appear to yield sporadic results. The very high dependence of electrical resistivity on sintering temperature is illustrated in the single FIGURE. A 1 percent change in sintering temperature resulted in an increase in resistivity from $10^2$ to $10^{10}$ or more Ohm cm. Also, higher temperatures may cause sublimation and decomposition of the silicon carbide material, resulting in a thick conductive surface layer consisting of mainly graphite and large grains throughout the sintered body.

It is to be understood that the temperatures reported as being operative and preferred herein have been obtained through use of a total radiation optical pyrometer which is calibrated using a tungsten wire calibrator. This instrument requires knowledge of the emissivity of the material whose temperature is being measured. While articles according to the present invention are being fired, they are not directly observed by the optical pyrometer. Due to the extremely high temperatures involved and the need to protect the furnace components and the article to be sintered from oxidation, the shaped green body is placed in a graphite crucible which is placed in or passed through the furnace. The innermost tube of the tube furnace is enveloped by a muffle. The pyrometer reading is actually that of the outer surface of the muffle. The accuracy of this technique is believed to be about plus or minus 1 percent of the temperature being measured.

The firing step can be carried out in a batch furnace or in a tube furnace in continuous mode of operation wherein the shaped body is passed through the hot zone of the tube furnace to have sufficient residence time at the necessary range of temperatures. The details of a suitable tube furnace are known in the prior art and are described, for example, in U.S. Pat. No. 3,689,220 to P. A. Smudski.

During sintering, the object being sintered is surrounded by nitrogen-containing gas. Pure nitrogen may be admixed with reducing gases which include hydrogen and carbon monoxide or inert gases which include the rare gases such as argon, helium, and neon. The gases in which the sintering operation can be carried out thus include nitrogen alone or in admixture with argon, helium, hydrogen and neon. The nitrogen may also be generated in situ from a solid source such as silicon nitride ($Si_3N_4$).

Firing may be, and preferably is, carried on in the absence of any externally applied pressure, save that which may occur due to the presence of a gas at a pressure up to about one atmosphere. Firing may be conducted in a partial vacuum. Such a firing or sintering process is referred to as being "pressureless." Firing in the presence of externally, mechanically applied pressure, i.e., "hot pressing," has not been successful in achieving desired electrical resistivity, except where the raw batch contains boron nitride. This is believed due to inability of the nitrogen to sufficiently permeate the body during sintering since nitrogen pressure is generally only about one atmosphere. Pressure may also be applied through a gas phase, which process is referred to as "hot isostatic pressing" or "hipping."

The exact role of boron carbide during sintering and development of the desired high electrical resistivity is not fully understood. It is believed that in situ conversion of $B_4C$ to BN is involved in development of a sintered silicon carbide product of high electrical resistivity. BN by itself is a well recognized electrical insulator; e.g., D.C. electrical resistivity of $10^{10}$ Ohm cm. The amount of boron carbide which may be present in the raw batch and the amount of boron present in sintered bodies having the desired electrical resistivity does not correlate to stoichiometric reaction with nitrogen from the furnace atmosphere or the amount of uncombined carbon present in the raw batch.

Because a furnace and crucibles and other fixtures typically used in the sintering of bodies of silicon carbide are formed of graphite or lined with a carbonaceous material, and boron and possibly boron carbide is soluble to a considerable extent in carbon or graphite at sintering temperature, the amount of boron carbide in the raw batch is adjusted in response to the effect of these on the composition of the raw batch and sintered body. Applicants have observed that use in continuous mode of two tube furnaces of identical design but of differing size and location have required raw batch composition to vary as much as 1 percent carbon and 0.5 percent $B_4C$ to obtain a sintered body of similar composition and electrical characteristics.

The resulting sintered body may, when of density of about 2.95 g/cm$^3$, and typically will, exhibit slight open porosity, e.g. about 5 volume percent. When density of the sintered body is about 3.15 g/cm$^3$, open porosity is only about 0.05 volume percent.

The microstructures of samples prepared from raw batches containing submicron alpha-phase silicon carbide, 1 percent $B_4C$ and 1 percent carbon derived from in situ decomposition of resin, and sintered at one atmosphere pressure in flowing argon at 2150° C. and nitrogen at temperatures ranging from 2225° to 2300° C. respectively, were studied using optical, secondary electron microscopy and transmission electron microscopy. The samples sintered in nitrogen had a D.C. electrical resistivity of $10^{10}$ to $10^{12}$ Ohm cm when the sintering temperature was 2250° to 2300° C. The argon sintered samples had a D.C. electrical resistivity of only 10 Ohm cm; the 2225° C. nitrogen sintered sample had a D.C. electrical resistivity of only 26 Ohm cm.

Samples sintered in nitrogen and having high D.C. electrical resistivity contain free carbon areas between at least a portion of the grains of silicon carbide. These free carbon areas contain substantial amounts of boron and nitrogen as determined by Electron Energy Loss spectra. These samples also contain discrete single phase boron nitride particles throughout the microstructure, including within the grains of silicon carbide. The boron nitride does not appear as a continuous grain boundary phase or film; the silicon carbide grain boundaries are not disrupted by the boron nitride. These samples exhibit larger and fewer pores than those sintered in argon. These pores are not continuously interconnected throughout the microstructure. There is more silicon carbide grain boundary to silicon carbide grain boundary contact area per unit volume than in samples which do not exhibit D.C. electrical resistivity of $10^8$ or more Ohm cm.

Samples sintered in argon are morphologically similar to those sintered in nitrogen having the desired high D.C. electrical resistivity. These argon sintered samples contain areas of free carbon throughout which are morphologically similar to those present in the desired nitrogen sintered samples, but these free carbon areas do not contain substantial amounts of boron and nitrogen. The argon sintered samples also contain a greater amount of porosity throughout; there is less silicon carbide grain boundary to silicon carbide grain boundary contact area per unit volume than in the desired nitrogen sintered samples. The argon sintered samples contain grains of $B_4C$ of usually 0.5 to 1.0 micron. No grain boundary phase or film was observed in the argon sintered samples.

As used herein, "open porosity" means that which is determined by water saturation (ASTM C20-74).

Various aspects of the invention will now be illustrated with several examples.

EXAMPLES 1-28

Alpha-phase silicon carbide powder having a specific surface area of 8-12 square meters/gram, finely divided boron carbide, phenol formaldehyde product available from Reichold Chemical, Inc., White Plains, NY, as Plyophen ™ 90-151, and temporary binder system, were mixed together and spray dried. Each lot number corresponded to a particular raw batch. The carbon value expressed in TABLE I is based on the expected char yield for the amount of resin contained in the raw batch. A portion of the dry raw batch powder was compressed at about 15,000 psi to achieve a green density above 1.6 g/cm$^3$. After pressng into a shaped body, the shaped body was placed on a graphite setter tile which was placed in a silicon carbide crucible. The shaped body was fed into a previously used 6 inch tube furnace, as described in U.S. Pat. No. 3.689,220, having a hot zone maintained at the temperature indicated in TABLE I below at a rate of about ¼ inch per minute so that the required time to traverse the hot zone of the furnace was about 45 minutes. Temperatures were measured using a Leeds & Northrop optical pyrometer. The sintering atmosphere was flowing nitrogen at one atmosphere pressure. Due to the small size of the sintered bodies produced in these examples, thermal shock during cooling under nitrogen is not a problem. When large bodies are being produced, an appropriate holding period in a cooling chamber under flowing nitrogen may be used to avoid rupture due to thermal shock. The sintered bodies were in the shape of discs of about 25 mm diameter and about 6 mm thickness. After the sintered body had cooled, its physical and electrical properties were observed to be as indicated in TABLE I.

D.C. electrical resistivity of all samples was measured according to ASTM 257-78, with the following specifications. Samples following sintering were cylinders of about 25 mm diameter and about 6 mm height, whose planar end surfaces were treated with electrically conductive silver paint and whose circumferential edge was ground to remove and conductive surface layer. The D.C. voltage applied was 100 V maximum. Wire electrodes were brought into contact with the silver painted end surfaces. In some samples, the planar end surfaces were ground prior to application of the silver paint, but such procedure does not appear to be necessary due to existence of a conductive surface layer on the samples as produced by sintering. Guard rings were not applied in most instances as surface leakage of the polished surfaces appears to be negligible. The results given in TABLE II indicate that uncombined carbon present in amount greater than about 2 percent of the raw batch greatly influences negatively the resistivity of the sintered product. As demonstrated by the data in TABLE I, the relationship is clearly non-linear.

Example number (7.) of TABLE I has a density of 3.2 g/cm$^3$ and an electrical resistivity of $10^{10}$ (E10) Ohm cm at 25° C. and 10 volts (D.C.).

The data contained in TABLE I demonstrates the criticality of sintering temperature on achieving the desired D.C. electrical resistivity of greater than $10^8$ Ohm cm at 25° C. The same minimum effective temperature of about 2275° C. was observed throughout sublots 1 through 4. It is also to be noted that use of a sintering temperature above the minimum effective temperature (threshold temperature) generally results in increased scatter in electrical resistivity. For each of the example numbers listed in parentheses in TABLE I there were actually sintered and tested four shaped bodies. Where a single value is given for each example number, little variation was observed within the population. Where significant variation was observed as for electrical resistivity of sample number (6), the lowest value and highest value observed are given. Of the four sublots evaluated, sublots 3 and 4 are considered best due to consistently high sintered density as well as high electrical resistivity. The data for sublot 3 are plotted in the FIGURE. Sublot 4 produced the lowest variation in electrical resistivity. The optimum raw batch for this furnace and particular silicon carbide powder appears to be about 1.3 percent B$_4$C and 0.75 percent free carbon derived from resin.

A.C. electrical properties were measured according to ASTM D 15-81. Samples were the same as those prepared and used in measurement of D.C. electrical properties. No guard rings were applied. The applied voltage was 5 volts (1 V A.C.) root mean square (RMS) unless otherwise specified.

TABLE I

| RAW BATCH COMPOSITION | | | SINTERING TEMPERATURE | | | | | | |
|---|---|---|---|---|---|---|---|---|---|
| % B$_4$C | % C | % SiC | 2200° C. | 2225° C. | 2250° C. | 2275° C. | 2300° C. | 2325° C. | 2350° C. |
| Density (g/cm$^3$) Sample numbers are enclosed in parentheses. D.C. electrical resistivity (Ohm cm) at 25° C. and 10 V D.C. | | | | | | | | | |
| Sublot 1 | | | | | | | | | |
|  |  |  | 2.50 | 1.90 | 2.91 | 3.05 | 3.09 | 2.95 | 3.02 |
| 1.0 | 0 | 99 | (1) | (2) | (3) | (4) | (5) | (6) | (7) |
|  |  |  | 4 | 23 | 12 | E10-E11 | E8-E10 | E7-E11 | E10 |
| Sublot 2 | | | | | | | | | |
|  |  |  | 2.66 | 2.94 | 2.92 | 3.10 | 3.15 | 3.10 | 3.13 |
| 1.0 | 0.5 | 98.5 | (8) | (9) | (10) | (11) | (12) | (13) | (14) |
|  |  |  | 4 | 36 | 17 | E11 | E8-E11 | E8-E11 | E8-E11 |
| Sublot 3 | | | | | | | | | |
|  |  |  | 2.84 | 3.04 | 3.10 | 3.14 | 3.17 | 3.16 | 3.16 |
| 1.0 | 1.0 | 98 | (15) | (16) | (17) | (18) | (19) | (20) | (21) |
|  |  |  | 2 | 5 | 680 | E11 | E8-E11 | E8-E11 | E9-E10 |
| Sublot 4 | | | | | | | | | |
|  |  |  | 2.71 | 2.08 | 3.02 | 3.10 | 3.14 | 3.14 | 3.13 |
| 1.3 | 0.5 | 98.2 | (22) | (23) | (24) | (25) | (26) | (27) | (28) |

TABLE I-continued

| RAW BATCH COMPOSITION | | | SINTERING TEMPERATURE | | | | | | |
|---|---|---|---|---|---|---|---|---|---|
| % $B_4C$ | % C | % SiC | 2200° C. | 2225° C. | 2250° C. | 2275° C. | 2300° C. | 2325° C. | 2350° C. |
| | 3 | 15 | | | 12 | E11 | E9-E11 | E9-E11 | E10-E11 |

Note:
E11 means $10^{11}$

EXAMPLES 29-33

Acheson-process alpha-phase silicon carbide powder having an oxygen content of 0.33 percent and a free carbon content of 0.31 percent and a surface area of 10.7 square meters/gram was used in the preparation of Examples 29-33, whose characteristics are tabulated in TABLE II. The raw batches were prepared in a manner similar to that described for Examples 1-28. Example 29 is representative of the results obtained following the preferred teachings of U.S. Pat. No. 4,312,954. Examples 30-33 demonstrate that highest D.C. electrical resistivity is obtained through use of a raw batch containing a greater amount of an amorphous, ultrafine $B_4C$ and a smaller amount of carbon source resin than is taught as preferred in U.S. Pat. No. 4,312,954. Examples 30-33 also exhibit essentially constant D.C. electrical resistivity between 10 and 100 volts.

was used in the preparation of Examples 34 through 45, whose characteristics are tabulated in TABLE III.

The raw batches were prepared in a manner similar to that described for Examples 1-28. Shaping and sintering was conducted as described for Examples 1-28. Sintering was conducted under flowing nitrogen at one atmosphere pressure at 2275° plus or minus 50° C. for about 45 minutes in the hottest zone of the tube furnace.

The data contained in TABLE III demonstrate the influence of varying the concentration of $B_4C$ and free carbon (derived from in situ decomposition of resin) in the raw batch. The observed presence of boron upon analysis of sample 40 is believed due to gas phase transfer from the graphite furnace parts and use of previously used graphite crucibles to hold the samples as they were pushed through the furnace.

The data in TABLE III demonstrate relationships between the composition of the raw batch, sintered

TABLE II

Sintering Conditions:
$N_2$ atmosphere, 2270° C. plus or minus 25° C., 10-inch diameter tube furnace, ¼"/minute push rate, approximate hottest zone time of 90 minutes.

| Example Number | SiC[1] Powder | $B_4C$ Powder wt. % | Carbon[4] wt. % | Sintered Density g/cm³ | D.C. Electrical Resistivity Ohm cm at 20° C. | | |
|---|---|---|---|---|---|---|---|
| | | | | | 10 V | 50 V | 100 V |
| 29 | Submicron | 0.78[2] | 2.0 | 3.14 | 8.9E6 | 5.6E6 | 3.87E6 |
| 30 | " | 1.0[2] | 1.5 | 3.16 | 6.69E11 | 4.73E11 | 3.36E11 |
| 31 | " | 1.0[3] | 1.5 | 3.19 | 1.02E12 | 9.48E11 | 8.54E11 |
| 32 | " | 1.25[3] | 1.5 | 3.17 | 1.2E12 | 1.04E12 | 9.60E11 |
| 33 | " | 1.50[3] | 1.5 | 3.16 | 1.54E12 | 1.50E12 | 1.37E12 |

[1] $O_2$ = 0.33%, Free Carbon = 0.31%.
[2] Submicron $B_4C$, approx. 8 m²/g.
[3] Callery Chemical amorphous $B_4C$, ultrafine >50 square meters/gram.
[4] Char yield expected from use of resin.

EXAMPLES 34-45

Acheson-process alpha-phase silicon carbide powder, having an oxygen content of 0.42 percent, a free silicon content of 0.25 percent, a free carbon content of 0.24 percent, and a surface area of 10.7 square meters/gram, properties and sintered composition of Examples 34-45. Example 36 exhibited the best electrical properties.

Following review of the results obtained for Examples 34-45, it was decided to expand the matrix of free carbon amount and boron carbide amount and to investigate the influence that particular furnaces might have.

TABLE III

| | Raw Batch Composition | | Characterization Of Sintered Product | | | | | | |
|---|---|---|---|---|---|---|---|---|---|
| Example Number | % $B_4C$ | % C Added | Bulk Dens. g/cm³ | Resistivity Ohm cm at 10 V D.C. | Dielectric Dissipation | | % N | % O | % Total Boron | % Free Carbon |
| | | | | | Constant | Factor at 10 MHz, 5 V A.C. | | | | |
| 34 | 0.5 | 0.0 | 2.70 | E2 | 1925 | .440 | 0.08 | 0.05 | 0.44 | 0.10 |
| 35 | 1.0 | 0.0 | 3.073 | 2.7E10 | 15.3 | .186 | 0.07 | 0.04 | 0.66 | 0.12 |
| 36 | 1.0 | 0.5 | 3.16 | 1.38E12 | 16.3 | .186 | 0.12 | 0.03 | 0.62 | 0.14 |
| 37 | 1.0 | 1.0 | 3.15 | 5.9E11 | 17.6 | .195 | 0.13 | 0.03 | 0.67 | 0.21 |
| 38 | 1.0 | 1.5 | 3.14 | 6.9E11 | 18.9 | .186 | 0.11 | 0.04 | 0.68 | 0.37 |
| 39 | 1.0 | 2.0 | 3.15 | 2.18E11 | 20 | .187 | 0.11 | 0.03 | 0.62 | 0.37 |
| 40 | 0.0 | 1.0 | 1.77 | E2 | 2242 | .069 | 0.09 | 0.08 | 0.08 | 0.77 |
| 41 | 0.25 | 1.0 | 2.27 | E2 | 2249 | .112 | 0.11 | 0.08 | 0.22 | 0.86 |
| 42 | 0.5 | 1.0 | 3.14 | 8.48E4* | 21.2 | .361 | 0.07 | 0.03 | 0.41 | 0.27 |
| 43 | 1.0 | 1.0 | 3.13 | 6.08E11 | 18.2 | .204 | 0.29 | 0.07 | 0.59 | 0.30 |
| 44 | 1.5 | 1.0 | 3.10 | 6.22E11 | 18.1 | .182 | 0.44 | 0.06 | 0.84 | 0.32 |
| 45 | 2.0 | 1.0 | 3.06 | 5.6E4 | 27.9 | 0.400 | 0.22 | 0.05 | 1.08 | 0.58 |

*Edges reground - D.C. resistivity remained low.

TABLE IV

| Example Number | Raw Batch Composition | | Furn | Characterization of Sintered Product | | | | |
|---|---|---|---|---|---|---|---|---|
| | % $B_4C$ | % C Added | | Bulk Density (g/cm³) | Resistivity Ohm cm at 10 V D.C. | % N | % O | % Free Carbon |
| 46 | 1.5 | 1.0 | A | 3.10 | 8.31E10 | 0.34 | 0.40 | 0.78 |
| 47 | 1.5 | 1.0 | B | 3.14 | 2.59E3 | 0.48 | 0.27 | 0.78 |
| 48 | 1.75 | 1.0 | A | 3.08 | 1.31E11 | 0.71 | 0.29 | 0.82 |
| 49 | 1.75 | 1.0 | B | 3.10 | 2.28E5 | 0.66 | 0.24 | 0.88 |
| 50 | 2.0 | 1.0 | A | 3.06 | 8.81E10 | 0.76 | 0.17 | 0.84 |
| 51 | 2.0 | 1.0 | B | 3.10 | 9.72E10 | 0.62 | 0.14 | 0.67 |
| 52 | 3.0 | 1.0 | A | 2.89 | T.L.T.M. | 1.40 | 0.20 | 1.23 |
| 53 | 3.0 | 1.0 | B | 3.04 | 1.75E11 | 1.54 | 0.26 | 0.93 |
| 54 | 4.0 | 1.0 | A | 2.76 | T.L.T.M. | 2.64 | 0.24 | 1.44 |
| 55 | 4.0 | 1.0 | B | 3.00 | 4.98E5 | 1.32 | 0.21 | 1.15 |
| 56 | 5.0 | 1.0 | A | 2.67 | T.L.T.M. | 2.80 | 0.24 | 1.75 |
| 57 | 5.0 | 1.0 | B | 2.89 | 1.58E7 | 1.84 | 0.20 | 1.49 |
| 58 | 0.5 | 1.0 | A | 3.15 | 1.28E9 | 0.26 | 0.14 | 0.54 |
| 59 | 0.5 | 1.0 | B | 2.92 | T.L.T.M. | 0.26 | 0.22 | 0.68 |
| 60 | 0.25 | 1.0 | A | 2.61 | 3.78E9 | 0.14 | 0.18 | 0.95 |
| 61 | 0.25 | 1.0 | B | 2.13 | T.L.T.M. | 0.08 | 0.21 | 0.98 |
| 62 | 0 | 1.0 | A | 1.97 | T.L.T.M. | 0.75 | 0.31 | 0.90 |
| 63 | 0 | 1.0 | B | 1.76 | T.L.T.M. | 0.042 | 0.22 | 0.94 |

EXAMPLES 46-63

Examples 46-63 were prepared from the same lot of silicon carbide powder used in preparation of Examples 34-45. The silicon carbide powder was mixed with resin in amount sufficient to provide 1 percent free carbon upon decomposition of the resin. The amount of $B_4C$ was varied from zero to 5.0 percent. Disc-shaped samples from each raw batch were sintered in each of two different furnaces. The results of these sintered samples are tabulated in TABLE IV. Those even-numbered examples indicated to have been sintered in furnace A were sintered in a 6 inch tube furnace under flowing nitrogen at one atmosphere pressure with about 45 minutes exposure at about 2300° C. The odd-numbered examples were sintered in furnace B, a 10 inch furnace of design similar to the 6 inch furnace. The odd-numbered examples were sintered under flowing nitrogen at one atmosphere pressure with about 1.5 hours exposure at about 2300° C.

The results in TABLE IV demonstrate that the specific sintering conditions can have a major influence on results. It is to be noted that use of furnace B did not result in sintered samples of at least $10^8$ (E8) Ohm cm unless the amount of $B_4C$ in the new batch was at least 2 percent. Those samples sintered in furnace A exhibited very low D.C. electrical resistivity as the amount of $B_4C$ in the raw batch was increased above 2 percent, whereas those samples sintered in furnace B obtained best resistivity when the amount of $B_4C$ in the new batch was 2 to 3 percent. Also, the resistivity of samples prepared from raw batch containing 4 or 5 percent $B_4C$ exhibited substantially greater D.C. electrical resistivity than their furnace A counterparts.

In TABLE IV, the term T.L.T.M. means "too low to measure," using the same instrumentation used in obtaining the remaining values.

EXAMPLES 64-65

A premix was formed of submicron alpha silicon carbide powder, 0.64 percent $B_4C$ and resin in amount sufficient to provide about 1.5 percent free carbon. To this base premix were added various amounts of finely divided aluminum powder (Reynolds Aluminum Co. 400). Samples were formed by pressing and sintering in nitrogen at one atmosphere pressure. The data listed in TABLE V demonstrate that small additions of aluminum can be tolerated without reducing resistivity below $10^8$ Ohm cm.

TABLE V

| Example Number | Composition % Al Added | Density (g/cc) | Resistivity Ohm cm at 10 VDC |
|---|---|---|---|
| 64 | 0.25 | 3.15 | E10-E9 |
| 65 | 1.0 | 3.12 | E9-E7 |

EXAMPLES 66-89

The possibility of using boron nitride (BN) directly to achieve pressureless sintered silicon carbide of high electrical resistivity was examined by preparing raw batches of the compositions listed in TABLE VI. Samples pressed from these compositions were sintered at the temperatures and in the atmospheres listed in TABLE VI. Only one of these examples 66-89 exhibited an electrical resistivity of at least $10^8$ Ohm cm at 25° C. and 10 V D.C., and that Example 89 had a specific gravity of 2.87 g/cm³.

EXAMPLE 90

A raw batch was prepared containing 1.0 percent $B_4C$ and resin in amount sufficient to provide 1.0 percent free carbon. The silicon carbide powder had a surface area of 15-18 square meters/gram and is known as "ultrafine quality Betarundum," available from Ibiden Company, Ltd., Japan.

Samples were pressed from this mixture and sintered in furnace B at about 2300° C. in nitrogen at one atmosphere with a hot zone exposure of about 1.5 hours. The sintered samples had an average density of about 3.05 g/cm³, an electrical resistivity of $6.23 \times 10^2$ Ohm cm at 25° C. and 10 V D.C., and a thermal conductivity of 54 W/mK (watts per meter kelvin).

EXAMPLE 91

Samples were press formed from a spray-dried mixture of alpha silicon carbide powder containing 1.0 percent $B_4C$ and resin in amount sufficient to provide 1.0 percent free carbon. These samples were placed in graphite crucibles which were placed in an electric resistance furnace (ASTRO brand). Nitrogen gas was introduced into the furnace while the furnace was maintained under vacuum of 10 Torr during sintering at 2275°–2300° C. for 45 minutes. These samples were in the form of plates of about 25×38×1.5 mm. The sintered plates were uniform in properties. Electrical resistivity at 25° C. and 1 V D.C. ranged from $1.1 \times 10^4$ to $1.52 \times 10^4$ Ohm cm. Density was 3.17 g/cm$^3$. Thermal conductivity was 122 W/mK.

EXAMPLE 92

Example 89 was repeated, except that vacuum was not applied to the furnace. Sintering conditions were flowing gas mixture of 50/50 volume percent of nitrogen and argon at one atmosphere, 2275° C. for 45 minutes. The sintered plates were extremely uniform in properties. Electrical resistivity at 25° C. and 1 V D.C. ranged from $1.1 \times 10^8$ to $1.4 \times 10^8$ Ohm cm over all eight plates. At 100 V D.C., resistivity ranged from $2.1 \times 10^8$ to $3.0 \times 10^7$ Ohm cm for all eight plates. Density ranged from 3.15 to 3.16 g/cm$^3$. Thermal conductivity was 69 W/mK.

EXAMPLE 93

A mixture of alpha-phase silicon carbide containing 1.0 percent B$_4$C and resin in sufficient amount to provide 1.0 percent free carbon was introduced into a graphite die having a 25 mm cylindrical bore and two opposed complementary cylindrical plungers. The sample was hot pressed at 3500–4000 psi for 30 minutes at 2275° C. in the presence of nitrogen gas at one atmosphere. The sintered sample had a density of 3.16 g/cm$^3$ and an electrical resistivity of $1.15 \times 10^3$ Ohm cm at 1 V D.C.

EXAMPLE 94

Samples were press formed from a raw batch of alpha silicon carbide powder containing 1.0 percent B$_4$C and resin sufficient to provide 1.0 percent free carbon. These samples were sintered in tube furnace A under the following conditions: 2275° C. for 45 minutes, nitrogen at one atmosphere pressure. Following pressureless sintering, electrical resistivity of these samples was $4.12 \times 10^{11}$ Ohm cm at 100 V D.C. and essentially constant from 1 through 100 V D.C.; density was 3.14 g/cm$^3$; dissipation factor was 1.419 at 100 Hz., 0.181 at 100 MHz.

The sintered samples were thereafter hot pressed for 45 minutes at 3000 psi and 2025° C. in nitrogen at one atmosphere. Following post hot pressing, these samples were determined to have the following properties: electrical resistivity of $2.84 \times 10^9$ Ohm cm at 1 D.C. and $5.47 \times 10^8$ Ohm cm at 100 V D.C.; dissipation factor of 0.574 at 100 Hz and 0.077 at 100 MHz.

EXAMPLES 95–97

Mixtures of alpha-phase silicon carbide powder and boron nitride powder were hot pressed at 5000 psi at 2000° C. in argon at one atmosphere pressure. The sintered samples had D.C. electrical resistivities of $10^{10}$ or more Ohm cm at 25° C.

| Example Number | Raw Batch Composition | Sintered Product Density (g/cm$^3$) | D.C. Resistivity (Ohm cm) |
|---|---|---|---|
| 95 | SiC + 2.0 BN | 3.20 | E11 |
| 96 | SiC + 5.0 BN | 3.14 | E11 |
| 97 | SiC + 11.5 BN | 3.02 | E10 |

TABLE VI

| Example Number | Composition of Raw Batch (weight %) | Sintering Temperature | Atmosphere | Bulk Density (g/cm$^3$) | Resistivity OHM cm at 10 V DC & 25° C. |
|---|---|---|---|---|---|
| 66 | SiC + 0.5 BN + 2.0 C | 2200° C. | Argon | 3.10 | $10^5$ |
| 67 | SiC + 1.0 BN + 2.0 C | 2200° C. | Argon | 3.07 | $10^5$ |
| 68 | SiC + 1.5 BN + 2.0 C | 2200° C. | Argon | 3.01 | $10^5$ |
| 69 | SiC + 2.0 BN + 2.0 C | 2200° C. | Argon | 2.94 | $10^5$ |
| 70 | SiC + 0.5 BN + 2.0 C | 2250° C. | N$_2$ | 3.01 | $10^5$ |
| 71 | SiC + 1.0 BN + 2.0 C | 2250° C. | N$_2$ | 3.03 | $10^6$ |
| 72 | SiC + 1.5 BN + 2.0 C | 2250° C. | N$_2$ | 2.97 | $10^6$ |
| 73 | SiC + 2.0 BN + 2.0 C | 2250° C. | N$_2$ | 2.91 | $10^7$ |
| 74 | SiC + 0.5 BN + 2.0 C + 0.5 B | 2200° C. | Argon | 3.08 | $10^4$ |
| 75 | SiC + 1.0 BN + 2.0 C + 0.5 B | 2200° C. | Argon | 3.02 | $10^4$ |
| 76 | SiC + 1.5 BN + 2.0 C + 0.5 B | 2200° C. | Argon | 2.91 | $10^3$ |
| 77 | SiC + 2.0 BN + 2.0 C + 0.5 B | 2200° C. | Argon | 2.89 | $10^3$ |
| 78 | SiC + 0.5 BN + 2.0 C + 0.5 B | 2250° C. | N$_2$ | 3.11 | $10^6$ |
| 79 | SiC + 1.0 BN + 2.0 C + 0.5 B | 2250° C. | N$_2$ | 3.06 | $10^7$ |
| 80 | SiC + 1.5 BN + 2.0 C + 0.5 B | 2250° C. | N$_2$ | 2.98 | $10^7$ |
| 81 | SiC + 2.0 BN + 2.0 C + 0.5 B | 2250° C. | N$_2$ | 2.94 | $10^7$ |
| 82 | SiC + 11.5 BN + 0.0 C + 0.2 B | 2250° C. | N$_2$ | 2.37 | $10^1$ |
| 83 | SiC + 2.0 BN | 2300° C. | N$_2$ | 2.36 | $10^7$ |
| 84 | SiC + 1.95 BN + 0.5 B$_4$C + 2.0 C | 2300° C. | N$_2$ | 3.12 | $10^6$ |
| 85 | SiC + 4.87 BN + 0.5 B$_4$C + 2.0 C | 2300° C. | N$_2$ | 3.03 | $10^6$ |
| 86 | SiC + 1.95 BN + 0.5 B$_4$C + 2.0 C | 2140° C. | Argon | 2.80 | $10^1$ |
| 87 | SiC + 4.87 BN + 0.5 B$_4$C + 2.0 C | 2140° C. | Argon | 2.76 | $10^1$ |
| 88 | SiC + 2.5 BN + 0.54 B$_4$C + 2.0 C | 2150° C. | Argon | 3.01 | $10^7$ |
| 89 | SiC + 5.0 BN + 0.64 B$_4$C + 2.0 C | 2200° C. | Argon | 2.87 | $10^9$ |

We claim:

1. An electrically insulating ceramic material comprising a sintered body composed essentially of polycrystalline, sintered silicon carbide, having between at least a portion of the silicon carbide grains thereof areas of uncombined carbon which areas contain both boron and nitrogen, and within the grains of silicon carbide, boron nitride precipitates, said sintered body having a D.C. electrical resistivity of $10^9$ Ohm cm or greater at 25° C.

2. An electricity insulating ceramic material comprising a sintered body composed essentially of:
   (a) up to 1.0 percent uncombined carbon;
   (b) 0.3 to 1.0 percent boron;
   (c) 0.03 to 0.8 percent nitrogen;
   (d) and a balance of silicon carbide;

said sintered body having a density of at least 2.95 g/cm$^3$ and a D.C. electrical resistivity of at least 10$^9$ Ohm cm at 25° C.

3. A sintered body according to claim 1, further composed essentially of:
(a) up to 1.0 percent uncombined carbon.,
(b) 0.3 to 1.0 percent boron.,
(c) 0.03 to 0.8 percent nitrogen;
(d) and a balance of silicon carbide; said sintered body having a density of at least 2.95 g/cm$^3$.

4. A sintered body according to claim 2 having a thermal conductivity of at least 55 W/mK.

5. A sintered according to claim 3 having a thermal conductivity of at least 55 W/mK.

6. A sintered body according to claim 2 additionally composed essentially of up to 0.5 percent oxygen.

7. A sintered body according to claim 1 having a density of at least 3.0 g/cm$^3$.

8. A sintered body according to claim 4 having a density of at least 3.0 g/cm$^3$.

9. A sintered body according to claim 2 composed essentially of not more than 0.6 percent nitrogen and 0.8 percent boron.

10. A sintered body according to claim 3 composed essentially of not more than 0.6 percent nitrogen and 0.8 percent boron.

11. A sintered body according to claim 3 having between 0.03 and 0.45 percent nitrogen and between 0.50 and 0.85 percent boron; said sintered body having a D.C. electrical resistivity of at least 10$^{10}$ Ohm cm at 25° C.

12. A sintered body according to claim 1 wherein said silicon carbide consists essentially of alpha-type silicon carbide.

13. A sintered body according to claim 2 wherein said silicon carbide consists essentially of alpha-type silicon carbide.

14. A sintered body according to claim 1 having a density of at least 3.10 g/cm$^3$, an electrical resistivlty of at least 10$^{11}$ Ohm cm and a thermal conductivity of at least 65 W/mK.

15. A sintered body according to claim 2 having a density of at least 3.10 g/cm$^3$, an electrical resistivity of at least 10$^{11}$ Ohm cm and a thermal conductivity of at least 65 W/mK.

16. A sintered body according to claim 1 produced by pressureless sintering at a temperature of about 2250° C. or greater.

17. A sintered body according to claim 2 produced by pressureless sintering at a temperature of about 2250° C. or greater.

18. A sintered body according to claim 1 produced by pressureless sintering at a temperature of between about 2275° and 2300° C.

19. A sintered body according to claim 2 produced by pressureless sintering at a temperature of between about 2275° and 2300° C.

20. A sintered body according to claim 1 having at 10 MHz and 25° C., a dielectric constant of not more than about 25 and a dissipation factor of not more than about 0.2.

21. A sintered body according to claim 2 having at 10 MHz and 25° C., a dielectric constant of not more than about 25 and a dissipation factor of not more than about 0.2.

22. A sintered body according to claim 1 produced by pressureless sintering in a nitrogenous atmosphere, at a temperature of about 2250° C. or greater, a shaped body having a density before sintering of at least about 1.45 g/cm$^3$, the shaped body composed essentially of:
(a) carbon or carbon source material in amount sufficient to provide upon in situ decomposition up to 2.5 percent uncombined carbon;
(b) from about 0.4 to about 2.0 percent boron carbide calculated as B$_4$C;
(c) a balance of silicon carbide which is predominately alpha-phase; and, in addition,
(d) up to 25 percent of temporary binder.

23. A sintered body according to claim 2 produced by pressureless sintering in a nitrogenous atmosphere, at a temperature of about 2250° C. or greater, a shaped body having a density before sintering of at least about 1.45 g/cm$^3$, the shaped body composed essentially of:
(a) carbon or carbon source material in amount sufficient to provide upon in situ decomposition up to 2.5 percent uncombined carbon;
(b) from about 0.4 to about 2.0 percent boron carbide calculated as B$_4$C; and
(c) a balance of silicon carbide which is predominately alpha-phase; and, in addition,
(d) up to 25 percent of temporary binder.

24. A sintered body according to claim 22 wherein sintering is conducted between about 2275° and 2350° C.

25. A sintered body according to claim 1 having at 10$^8$ or more Hz and 25° C. a dielectric constant of less than 15.

26. A sintered body according to claim 2 having at 10$^8$ or more Hz and 25° C. a dielectric constant of less than 15.

27. A sintered body according to claim 1 having at 10$^6$ Hz and 25° C. a dissipation factor of less than 0.2.

28. A sintered body according to claim 2 having at 10hu 6 Hz and 25° C. a dissipation factor of less than 0.2.

29. A sintered body according to claim 1 having at 10$^8$ or more Hz and 25° C. a dissipation factor of less than 0.1.

30. A sintered body according to claim 2 having at 10$^8$ or more Hz and 25° C. a dissipation factor of less than 0.1.

31. A process for the production of a silicon carbide ceramic body having a D.C. electrical resistivity of at least 10$^8$ Ohm cm at 25° C., comprising:
(a) forming a shaped body having a density, before sintering, of at least about 1.45 g/cm$^3$, the shaped body composed essentially of:
(i) carbon or carbon source material in amount sufficient to provide upon in situ decomposition up to 2.5 percent uncombined carbon;
(ii) from about 0.4 to about 2.0 percent boron carbide calculated as B$_4$C.
(iii) a balance of silicon carbide which is predominately alpha-phase; and, in addition,
(iv) up to 25 percent of temporary binder, and
(b) sintering said shaped body under substantially pressureless conditions in a nitrogenous atmosphere at a temperature of about 2250° C. or greater, for a time sufficient to produce a sintered body having a density of at least 2.95 g/cm$^3$ and an electrical resistivity of at least 10$^8$ Ohm cm at 25° C.

32. The process of claim 31 wherein the shaped body is composed essentially of up to 2 percent uncombined carbon; from about 0.5 to 1.5 percent boron carbide; sintering said shaped body at between about 2275° C. and 2350° C.

33. The process of claim 32 wherein flowing nitrogen is introduced during the sintering process in an amount of at least 50 percent by volume.

34. The process of claim 31 wherein the shaped body is composed essentially of about 1 percent uncombined carbon derived from carbon source material; about 1 percent boron carbide; sintering said shaped body at a temperature and for a time sufficient to produce a sintered body having an electrical resistivity of at least $10^{10}$ Ohm cm at 25° C.

35. An electrically insulating ceramic material comprising a sintered boyd composed essentially of polycrystalline, pressureless sintered slicon carbide, said sintered body having a D.C. electrically resistivity of at least about $10^{10}$ Ohm cm at 25° C.

* * * * *